United States Patent
Vaufrey (10) Patent No.: US 9,666,760 B2
(45) Date of Patent: May 30, 2017

(54) METHOD REGARDING A LIGHT-EMITTING DIODE FOR WHICH THE ARRANGEMENT OF AN ELECTRODE ON AN EMITTING FACE IS DETERMINED AS A FUNCTION OF THE SPREADING LENGTH OF THE CURRENT IN SAID LIGHT-EMITTING DIODE

(71) Applicant: COMMISSARIAT A L'ENERGIE ATOMIQUE ET AUX ENERGIES ALTERNATIVES, Paris (FR)

(72) Inventor: David Vaufrey, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/465,430

(22) Filed: Aug. 21, 2014

(65) Prior Publication Data
US 2015/0056728 A1 Feb. 26, 2015

(30) Foreign Application Priority Data

Aug. 23, 2013 (FR) .................................. 13 58146

(51) Int. Cl.
*H01L 33/38* (2010.01)
*H01L 33/40* (2010.01)
*H01L 33/12* (2010.01)

(52) U.S. Cl.
CPC .................................... *H01L 33/38* (2013.01)

(58) Field of Classification Search
None
See application file for complete search history.

(56) References Cited

U.S. PATENT DOCUMENTS

2007/0181888 A1* 8/2007 Kim et al. ...................... 257/79
2009/0023239 A1 1/2009 Erchak et al.
(Continued)

OTHER PUBLICATIONS

Guo et al., "Current crowding in GaN/InGaN light emitting diodes on insulating substrates", Journal of Applied Physics, vol. 90, No. 8, Oct. 15, 2001, pp. 4191-4195; in English; Cited in French Search Report.
(Continued)

*Primary Examiner* — Kimberly Rizkallah
*Assistant Examiner* — Bo Bin Jang
(74) *Attorney, Agent, or Firm* — Westerman, Hattori, Daniels & Adrian, LLP (57) ABSTRACT

The light-emitting diode comprises a first electrode intended to inject carriers of a first type into a stack of the light-emitting diode and arranged on an emissive face of the stack, a second electrode intended to inject carriers of a second type into the stack, and an emissive surface delimited by areas of the emissive face of the stack not covered by the first electrode. The first electrode is configured in such a way that any point of the emissive surface is situated no more than a predetermined distance from the first electrode dependent on the spreading length of the light-emitting diode. The method comprises a step of determining the spreading length of the light-emitting diode intended to be equipped with the first electrode and a step determining a characteristic of the first electrode from the determined spreading length.

26 Claims, 3 Drawing Sheets

(56) References Cited

U.S. PATENT DOCUMENTS

2010/0264401 A1* 10/2010 Adivarahan et al. ........... 257/13
2012/0146047 A1    6/2012 Kneissl et al.
2013/0146907 A1* 6/2013 Lunev et al. ................... 257/94

OTHER PUBLICATIONS

Kim et al., "Measurements of current spreading length and design of GaN-based light emitting diodes", Applied Physics Letters, 90, 063510, 2007, 3 pages; in English; Cited in French Search Report.
French Search Report dated Apr. 8, 2014 issued in corresponding application No. FR1358146; with partial English translation and machine-translation.

* cited by examiner

FIG.7 though the prior art teaches forms of distribution of the electrode on the emissive face of the light-emitting diode, it does not suggest any precise rule. Furthermore, nor does it specify how to optimise the flux emitted by the light-emitting diode.

METHOD REGARDING A LIGHT-EMITTING DIODE FOR WHICH THE ARRANGEMENT OF AN ELECTRODE ON AN EMITTING FACE IS DETERMINED AS A FUNCTION OF THE SPREADING LENGTH OF THE CURRENT IN SAID LIGHT-EMITTING DIODE

This application claims the priority of French Patent Application No. 1358146 filed Aug. 23, 2013.

TECHNICAL FIELD OF THE INVENTION

The invention relates to the field of light-emitting diodes, and more particularly to an arrangement of the electrode formed on an emissive face of a stack of the light-emitting diode.

The subject of the invention is more particularly a method for creating a first carrier injection electrode for a light-emitting diode using a determined spreading length of said light-emitting diode.

STATE OF THE ART

A light-emitting diode generally consists of a stack of at least two semiconductor materials of opposite conductivity type and inserted between two electrodes. When a voltage is applied between the two electrodes, carriers are injected via said electrodes into the stack of semiconductors, then are transported in the semiconductors. Electrons are injected from the cathode, whereas holes are injected from the anode. Electron-hole pairs can be formed in an active area of the stack, and can culminate in excitons, which can be de-excited radiatively. The photons generated can escape from the stack of semiconductors if, at least, one of the electrodes is transparent or semitransparent, or if one of the electrodes does not completely cover an emissive face of a stack of the light-emitting diode, or else if a combination of the two possibilities described above is used.

Figure 1:
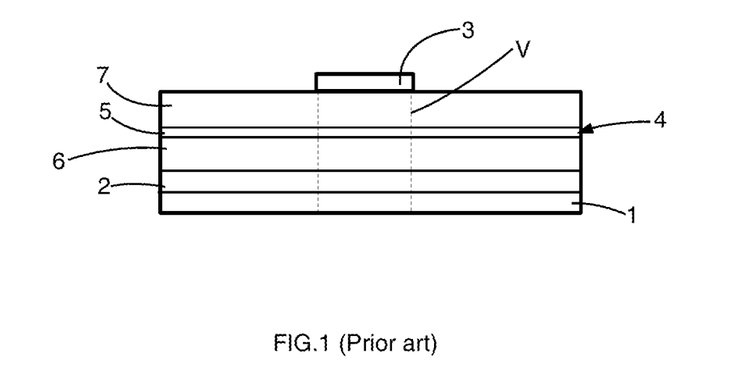
FIG. 1 is a side view of a realisation according to the state of the art.

FIG. 1 illustrates, by a side view, an example of a light-emitting diode in a thin-film configuration (configuration also known by the acronym VTF, standing for "Vertical Thin Film"). An electrode 1 fully covers the rear face of a semiconductor substrate 2. Another electrode 3 only partially covers the top face of a stack 4 of semiconductors formed on the top face of the substrate 2. It can also be considered that the stack 4 comprises the substrate 2. The stack 4 of semiconductors comprises an active layer 5 inserted between two transport layers 6, 7 of opposite conductivity type. Through the structuring of the electrodes 1 and 3, the current lines are concentrated in the stack 4 of semiconductors in a volume minimising the distance between the two electrodes 1 and 3. In other words, the current is mainly concentrated in the active layer 5 at the level of the volume V of the active layer 5 shadowed by the electrode 3 only partially covering the top face of the stack 4 of semiconductors. Thus, the current density is maximum and constant in the volume V of the active layer 5 shadowed by the electrode 3 only partially covering the top face of the stack 4 of semiconductors.

Since the luminance of a light-emitting diode is proportional to the current density passing through the light-emitting diode at the active layer 5, the luminance distribution therefore rapidly decreases with lateral distance away from the area situated under the electrode 3. If the electrode 3 is not transparent, only the photons emitted in the area peripheral to the volume V of the region of emission can escape from the light-emitting diode.

To do away with this limitation, the prior-art documents teach a number of strategies.

One of these strategies consists in introducing a spreading layer between the electrode 3 and the active layer 5. The spreading layer is characterized by a high conductivity. When the light-emitting diode is provided with a spreading layer, the current diverges more widely and the region of emission covers a greater surface area.

Another strategy consists in using a planar structuring of the electrode 3 allowing for a more uniform distribution of the current in the stack of semiconductors. However, although the prior art teaches forms of distribution of the electrode on the emissive face of the light-emitting diode, it does not suggest any precise rule. Furthermore, nor does it specify how to optimise the flux emitted by the light-emitting diode.

OBJECT OF THE INVENTION

The aim of the present invention is to propose a solution which remedies the drawbacks listed above.

This aim is sought through the attached claims, and notably by virtue of a method for creating a first carrier injection electrode for a light-emitting diode comprising: the first electrode intended to inject carriers of a first type into a stack of the light-emitting diode and arranged on an emissive face of the stack, a second electrode intended to inject carriers of a second type into the stack, and an emissive surface delimited by areas of the emissive face of the stack not covered by the first electrode, the first electrode being configured in such a way that any point of the emissive surface is situated at no more than a predetermined distance from the first electrode dependent on the spreading length of the light-emitting diode, and the first electrode comprising a plurality of branches substantially parallel to one another, the distance separating two adjacent branches being between ⅔ of the spreading length and 1 times the spreading length plus 200 μm. Said method comprises a step of determining the spreading length of the light-emitting diode intended to be equipped with the first electrode, and a step of determining at least one characteristic, notably the form, of the first electrode from the determined spreading length.

The spreading length may be calculated from characteristics of the stack and of the second electrode.

The spreading length being less than or equal to 60 μm, the distance separating two adjacent branches of the first electrode may be between 2 times the spreading length and 2.5 times the spreading length plus 50 μm.

The spreading length being greater than or equal to 30 μm, the distance separating two adjacent branches of the first electrode may be between ⅔ times the spreading length plus 50 μm and ⅔ times the spreading length plus 200 μm.

Preferably, the width of each branch of the plurality of branches of the first electrode is less than 10 μm, and preferably less than or equal to 5 μm.

The first electrode may comprise two additional sections linking all the longitudinal ends of the branches of the plurality of branches and forming, with two distal branches of the plurality of branches, a closed track surrounding all the other branches of the plurality of branches.

The emissive face of the stack may comprise a peripheral edge away from the first electrode by a distance of between ¼ and ½ of the spreading length.

The invention is also related to a method for fabricating a light-emitting diode, wherein it comprises: a step of implementing the method for creating the first electrode as describes, and a step of forming the first electrode on the emissive face of the stack of the light-emitting diode.

BRIEF DESCRIPTION OF THE DRAWINGS

Other advantages and features will emerge more clearly from the following description of particular embodiments of the invention, given as nonlimiting examples, and represented in the attached drawings, in which.

DESCRIPTION OF PREFERRED EMBODIMENTS OF THE INVENTION

The present invention more particularly addresses the link between the spreading length of the current in the light-emitting diode and the forms adopted by the electrode of the light-emitting diode situated at the interface of an emissive face of a stack of the light-emitting diode.

In the present description, the spreading length of the light-emitting diode refers to the spreading length of the current of the light-emitting diode.

Figure 2:
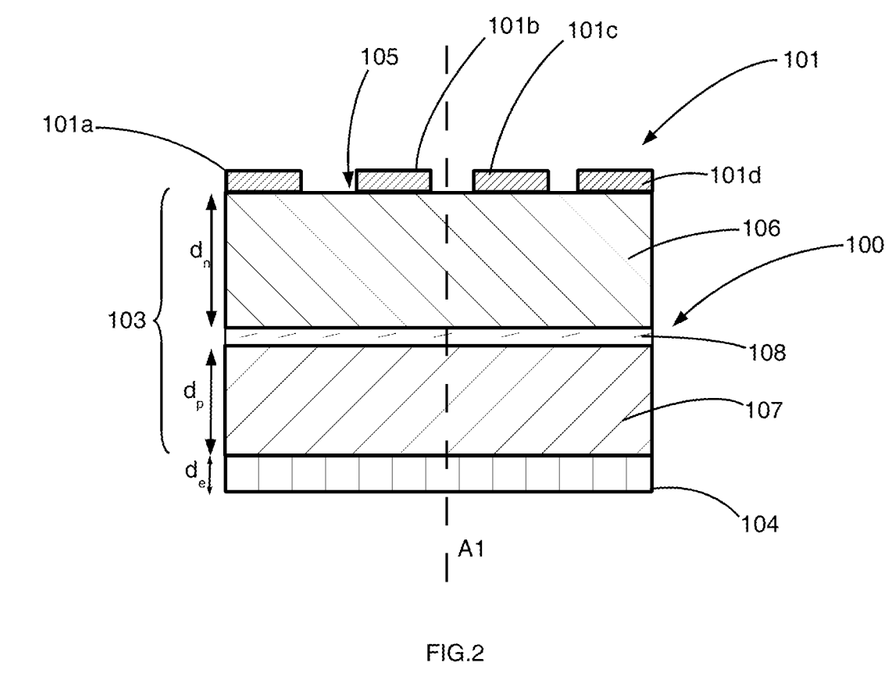
FIG. 2 illustrates a lateral cross-sectional view of a realisation according to an embodiment of the invention.

As illustrated in FIG. 2, the light-emitting diode 100 comprises a first electrode 101 intended to inject carriers of a first type into a stack 103 of the light-emitting diode 100. This first electrode 101 is arranged on an emissive face 105 of the stack 103. The light-emitting diode 100 also comprises a second electrode 104 intended to inject carriers of a second type into the stack 103. An emissive surface of the light-emitting diode is delimited by areas of the emissive face 105 of the stack 103 not covered by the first electrode 101. In the non-limiting example of FIG. 2, the first electrode 101 comprises a plurality of branches 101a, 101b, 101c, 101d that are preferentially substantially parallel.

In the present description, "substantially parallel" should be understood to mean exactly parallel or parallel to plus or minus 5 degrees according to the constraints of fabrication of said branches of the first electrode 101.

In the present description, "substantially perpendicular" should be understood to mean exactly perpendicular or perpendicular to plus or minus 5 degrees.

The stack 103 can comprise a first semiconductor element 106 notably n-doped, in which the first electrode 101 injects carriers and a second semiconductor element 107, notably p-doped, in which the second electrode 104 injects carriers. More generally, the stack 103 of a light-emitting diode is also called, in the field, a stack of semiconductors. The first and second semiconductor elements 106 and 107 each, for example, taking the form of a layer, can be separated from one another by an active layer 108 comprising, for example, quantum wells favouring the recombination of the carriers injected by the first and second electrodes 101, 104.

More particularly, the first and second electrodes are arranged on either side of the stack. Thus, as can be seen in the figures, at least a part of the second electrode can be facing the first electrode, thus forming a shadow between the first and second electrodes.

According to a particular embodiment, the first semiconductor element 106 is an N-doped layer of gallium nitride (GaN), preferably with a resistivity of $1^e$–3 Ohm·cm, and the second semiconductor element 107 is a layer of P-doped gallium nitride (GaN), preferably with a resistivity of 1 Ohm·cm. In this case, the first electrode 101 is the cathode arranged on the external face of the N-doped layer which notably exhibits the lower resistivity.

Thus, it is understood that the first electrode 101 advantageously corresponds to the electrode adjacent to the layer of higher conductivity (of lower resistivity).

The emissive surface of a diode is defined by the face of the light-emitting diode through which the majority of the photons are emitted.

In particular, the emissive face 105 is preferably, depending on the direction in which the stack 103 is produced, a first end face of the stack 103. It can then be considered that this first end face is included in a plane at right angles to the stack direction (axis A1 of FIG. 2). This first face of the stack 103 is opposite to a second face of the stack 103 preferentially arranged at the interface with the second electrode 104. In other words, between the first and second electrodes 101, 104 extend the different layers forming the stack 103 staged in the stack direction. Preferably, the second end face of the stack 103 is totally covered by the second electrode 104. The stack 103 can also comprise a substrate that has made it possible to form the rest of the stack, this substrate is then electrically conductive to allow the injection of charges through said substrate.

Figure 3:
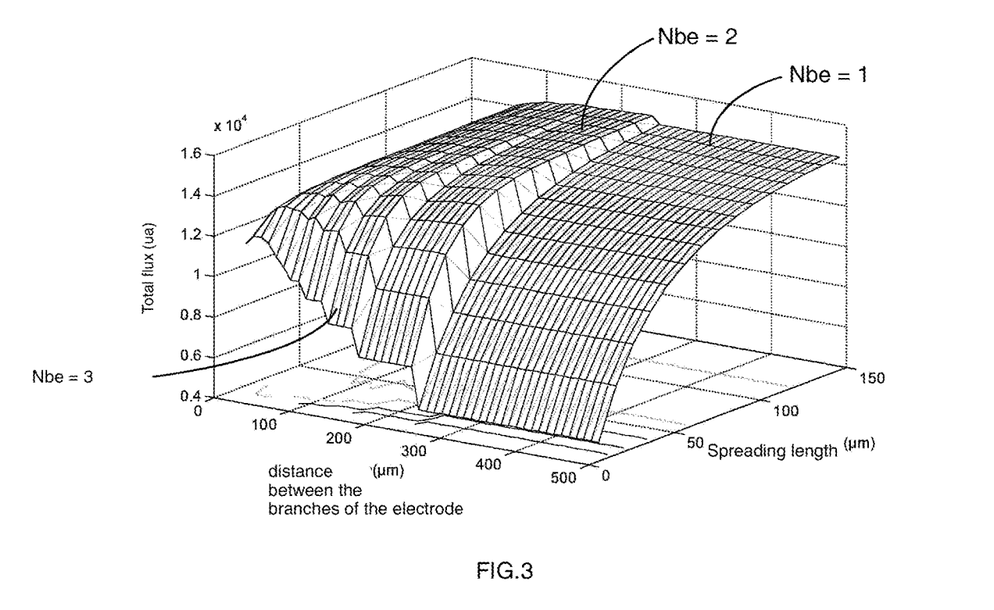
FIG. 3 illustrates the influence of the number of branches of an electrode as a function of the total flux emitted by a light-emitting diode, of the distance between the branches of the electrode, and of the spreading length of the current in the light-emitting diode.

In the context of the development of the invention, it has surprisingly been revealed that the multiplication of branches of the electrode, although generating additional shadow areas on the emission face 105 of the stack 103 of the light-emitting diode 100, could be beneficial because of a better efficiency of the non-shadowed areas. In this respect, FIG. 3 schematically illustrates the total flux emitted by a light-emitting diode measured as a function of the distance separating two adjacent branches of an electrode (in other words, as a function of the number of branches Nbe of an electrode arranged on the emissive face 105 of the stack) present on the emissive face of the stack 103 of the light-emitting diode 100 and as a function of the spreading length of the current in the light-emitting diode. In FIG. 3, for each step of the plotted surface there is a corresponding incrementation of Nbe by one unit.

It appears from the analysis of FIG. 3 that, by using a single spot electrode (Nbe=1), it is essential to increase the spreading length of the current in the light-emitting diode to achieve significant optical fluxes, and that, more surprisingly, it is necessary to multiply the number of branches of the electrode, to the detriment of the emissive surface area, to achieve significant optical fluxes if the light-emitting diode does not display a sufficient spreading length. It will be noted that the optical fluxes obtained with an optimum number of branches of the first electrode 101 make it possible to achieve flux values of the same order of, or even slightly greater than, the flux emitted by a light-emitting diode that has only a single electrode branch and that has a great spreading length. For example, for a light-emitting diode of 1×1 mm, Flux(Spreading length=150 μm, inter-electrode distance=500 μm)~Flux(Spreading length=50 μm, inter-electrode distance=80 μm for Nbe=6).

It is then understood that the increase in the efficiency of the light-emitting diode revealed by the increase in the number of branches of the first electrode depends in fact on the distance separating any point of the emissive surface from the first electrode 101. In other words, more generally, the first electrode 101 is configured in such a way that any point of the emissive surface is situated at no more than a predetermined distance from the first electrode 101 dependent on the spreading length of the light-emitting diode 100.

In fact, the spreading length corresponds to the distance for which the current density has dropped by a ratio 1/e between a first point contained in the plane of the active layer and peripheral to the volume V (volume shadowed by the first electrode) and a second point contained in the same plane. In other words, the current spreading length can correspond to the distance between a first point defined by the intersection of the plane of the active layer with the height at a peripheral point of the electrode 101 relative to the plane of the electrode 104, and a second point situated in the plane of the active layer for which the ratio between the current density at this second point divided by the current density at the first point is equal to 1/e.

As an example, the spreading length Ls of a light-emitting diode according to FIG. 2 can be calculated as follows:

$$Ls \sqrt{(\Sigma \rho_c + \Sigma \rho_\perp \cdot d_\perp) \cdot \left|\frac{\rho_n}{d_n} - \frac{\rho_e}{d_e}\right|^{-1}} \qquad \text{equation (1)}$$

With $\rho_n$, $\rho_e$, $\rho_p$ being the respective resistivities of the first n-doped semiconductor element 106, of the second electrode 104 and of the second p-doped semiconductor element 107 (notably used in the sums $\Sigma \rho_c$ and $\Sigma \rho_\perp \cdot d_\perp$), $d_n$, $d_e$, $d_p$ being the thicknesses in the direction of the stack (axis A1) respectively of the first n-doped semiconductor element 106, of the second electrode 104 and of the second p-doped semiconductor element 107 (notably used in the sums $\Sigma \rho_c$ and $\Sigma \rho_\perp \cdot d_\perp$), $\Sigma \rho_c$ corresponding to the sum of the contact resistances between the different materials of the light-emitting diode. This value can prove difficult to access, and also the formula can be simplified by disregarding it, $\Sigma \rho_\perp \cdot d_\perp$ corresponding to the sum of the products of the resistivity and of the thickness of the different materials passed through by an axis A1 normal to the plane of the light-emitting diode.

By trial and error, it is also possible to determine a spreading length Ls. This can be done simply by biasing, between two biasing probes, the light-emitting diode for which Ls is sought, with a voltage that is non-zero and greater than the light-emitting threshold voltage of the diode, and by measuring the decrease in voltage or current as a function of the distance between a measurement probe moving around on the emissive surface of the diode and the biasing probe applied to the electrode 101 in contact with the emissive face 105. The spreading length then corresponds to the distance at which the current has dropped by a factor 1/e, and/or at which the voltage has dropped by kT/q (i.e. 25 mV). This method is valid only if the semiconductor-electrode contacts are ohmic and non-Schottky (which is generally the case for the light-emitting diodes marketed).

Figure 4:
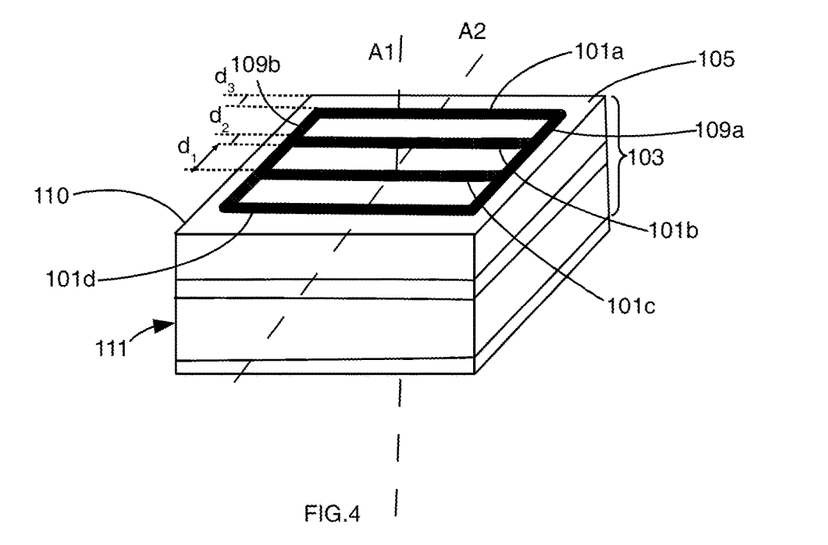
FIG. 4 illustrates a perspective view of an embodiment according to the invention.

According to the embodiment illustrated in FIG. 4, the first electrode 101 comprises a plurality of branches 101a, 101b, 101c, 101d substantially parallel to one another. Preferably, the distance d1 separating two adjacent branches is between ⅔ of the spreading length and 1 times the spreading length plus 200 μm. "Two adjacent branches" is understood to mean that the electrode does not comprise any branch(es) situated between these two adjacent branches. It is then understood that each branch can comprise two opposite longitudinal ends and that the two adjacent branches are separated by the distance d1 between their two opposite longitudinal ends. In fact, the presence of these branches makes it possible to limit the surface area of the emissive face 105 of the stack 103 covered by the first electrode 101 while ensuring that no point of the emissive surface is further away from the closest branch by a predetermined distance.

In other words, the first electrode can be configured in such a way that any point of the emissive surface is advantageously situated at a maximum distance from the first electrode 101 of between ⅓ of the spreading length Ls and ½ of the spreading length plus 100 μm. More generally, the first electrode can be configured in such a way that any point of the emissive surface is advantageously situated at a maximum distance from the first electrode 101 lying between two fine functions dependent on the spreading length.

Preferably, between their opposite longitudinal ends, the branches are not electrically linked by other parts of the first electrode 101. In other words, the branches form a one-dimensional mesh, unlike a two-dimensional meshing which would form a grid, so as to limit the covering of the emissive face by said first electrode 101.

According to a first implementation of the light-emitting diode, in the context where the spreading length is less than or equal to 60 μm, the distance separating two adjacent branches of the first electrode 101 is between 2 times the spreading length and 2.5 times the spreading length plus 50 μm. This separation distance is preferably between these limits (2 times the spreading length and 2.5 times the spreading length plus 50 μm) between any point of a first lateral side of a first branch adjacent to a second lateral side of a second branch, said first and second branches obviously being adjacent to one another. This distance applies preferentially to all the pairs of adjacent branches of the plurality of branches of the first electrode 101. In fact, these conditions are derived from FIG. 5 where the curve C1 illustrates the different optimum distance values between two adjacent branches of the electrode 101 as a function of the spreading length of the diode (that is to say, as a function of the structure of the light-emitting diode). The curves C2 and C3, in the form of straight lines, illustrate preferred limits, respectively associated with 2 times the spreading length and 2.5 times the spreading length plus 50 μm, ensuring a good trade-off between the surface area of the emissive face covered by the first electrode 101 and the effectiveness of the light-emitting diode. In fact, the straight lines C2 and C3 are advantageously such that the spreading length is less than 60 μm, all the points of the curve C1 lie between these two straight lines C2, C3.

According to a second implementation of the light-emitting diode, in the context where the spreading length is greater than or equal to 30 μm, the distance separating two adjacent branches of the first electrode 101 is between ⅔ times the spreading length plus 50 μm and ⅔ times the spreading length plus 200 μm. This separation distance is preferably between these limits (⅔ times the spreading length plus 50 μm and ⅔ times the spreading length plus 200 μm) between any point of a first lateral side of a first branch adjacent to a second lateral side of a second branch, said first and second branches obviously being adjacent to one another. This distance preferentially applies to all the pairs of adjacent branches of the plurality of branches of the first electrode 101. In fact, these conditions are derived from FIG. 6 where the curve C1 illustrates the different optimum values of the distance between two adjacent branches of the electrode 101 as a function of the spreading length of the diode (that is to say, as a function of the structure of the light-emitting diode). The curves C4 and C5, in the form of straight lines, illustrate the preferred limits respectively associated with ⅔ times the spreading length plus 50 μm and ⅔ times the spreading length plus 200 μm.

Figure 5:
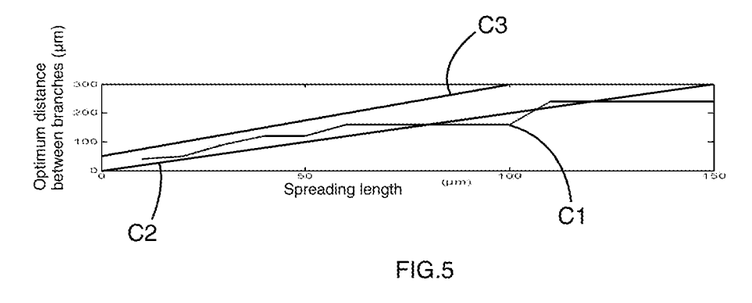
FIGS. 5 and 6 illustrate how two ranges of distances between two branches of an electrode are chosen, respectively, from a curve giving the trend of the optimum distance between two branches of a same electrode as a function of the spreading length.
Figure 6:
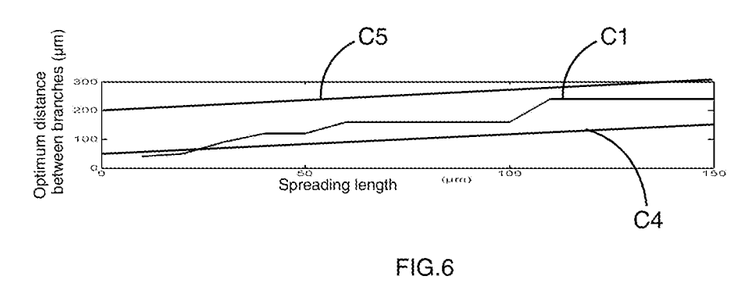

In the first and second implementations described above, in case of overlapping of the range, preference will be given to using the limits associated with the curves C2 and C3 because the light-emitting diode obtained is more efficient.

Preferably, Ls is less than 300 μm; this stems from the fact that, generally, beyond 300 μm, the issue of spreading no longer applies in the light-emitting diode.

Preferably, the width d2 of each branch 101a, 101b, 101c, 101d of the plurality of branches of the first electrode is less than 10 μm, and preferably less than or equal to 5 μm. Depending on the technology used, the minimum width d2 can be 1 μm or be of the order of 100 nm, even less. In practice, the resistance induced by such an electrode remains low, that is to say less than the resistance induced by the crossing of the first semiconductor element and/or of the second semiconductor element of which the light-emitting diode is composed. Furthermore, the resistance of the first electrode 101 can be reduced even more by increasing the thickness of the electrode.

Advantageously, the first electrode 101 comprises two additional sections 109a, 109b linking, notably electrically, all the longitudinal ends of the branches of the plurality of branches and forming, with two distal branches 101a, 101d of the plurality of branches, a closed track surrounding all the other branches of the plurality of branches. Two "distal" branches should be understood to mean the two branches furthest away from one another (the branches of the plurality of branches being staged along the axis A2 of FIG. 4). In other words, each branch of the plurality of branches comprises a first end and a second end, one of the additional sections being substantially perpendicular to the branches of the plurality of branches and passing through all the first ends and the other additional section being substantially perpendicular to the branches of the plurality of branches and passing through all the second ends. Preferably, the width of these two additional sections 109a, 109b is less than 10 μm, and preferably less than or equal to 5 μm, and is so for the same reasons as the width of the branches described above.

Still according to FIG. 4, the emissive face of the stack can comprise a peripheral edge 110 preferentially away from the first electrode 101 (in particular from the two additional sections 109a, 109b and the two branches 101a, 101d of the electrode that are distal to one another) by a distance $d_3$ of between ¼ and ½ of the spreading length of the light-emitting diode. This distance makes it possible to minimise the surface area of the emissive face 105 covered by the first electrode 101. In fact, the peripheral edge 110 is formed by the interface between a first end face of the stack (forming the emissive face 105) and a lateral wall 111 of the stack linking the first end face of the stack to the second end face of the stack in contact with the second electrode 104.

The invention also relates to a method for creating a first carrier injection electrode 101 for a light-emitting diode as described previously. Such a creation method can comprise a step of determining the spreading length of the light-emitting diode intended to be equipped with the first electrode 101. This spreading length can be determined by calculation by using the equation (1) above, once the structure of the desired stack extending from the second electrode is known, or be determined from a benchmark device comprising at least the desired second electrode and a desired stack on which the probes described previously are used to determine, by trial and error, the associated spreading length. It is understood then that the spreading length can be calculated from characteristics of the desired stack and of the desired second electrode or else from an experimental device comprising at least the desired second electrode and the desired stack.

Then, the creation method comprises a step of determining at least one characteristic of the first electrode 101 from the determined spreading length. This step of determining the first electrode 101 makes it possible, for example, to define the form and the dimensions of said first electrode 101 to be placed on the emissive face 105 of the stack 103.

"Form of the first electrode" should be understood to mean the number of branches, the manner in which they are linked, etc.

This step of determining at least one characteristic can be such that each determined characteristic can be associated with a particular limitation of the first electrode. In other words, in the context of the step of determining said at least one characteristic, notably the form, of the first electrode 101 (created) from the determined spreading length, said at least one determined characteristic can be such that:

the first electrode 101 is configured in such a way that any point of the emissive surface is situated at no more than a predetermined distance from the first electrode 101 dependent on the determined spreading length of the light-emitting diode, the first electrode 101 comprises a plurality of branches 101a, 101b, 101c, 101d substantially parallel to one another, notably the distance d1 separating two adjacent branches being between ⅔ of the determined spreading length and 1 times the determined spreading length plus 200 μm.

In the above case, it is considered that, in the context of the method, the light-emitting diode comprises: the first electrode 101 intended to inject carriers of a first type into a stack 103 of the light-emitting diode 100 and arranged on an emissive face 105 of the stack 103; a second electrode 104 intended to inject carriers of a second type into the stack 103; and an emissive surface delimited by areas of the emissive face 105 of the stack 103 not covered by the first electrode 101.

Similarly, the step of determining said at least one characteristic, notably the form, of the first electrode 101 (created) from the determined spreading length can be such that:

The determined spreading length being less than or equal to 60 μm, the distance separating two adjacent branches of the first electrode 101 created is between 2 times the determined spreading length and 2.5 times the determined spreading length plus 50 μm.

The determined spreading length being greater than or equal to 30 μm, the distance separating two adjacent branches of the first electrode 101 created is between ⅔ times the determined spreading length plus 50 μm and ⅔ times the determined spreading length plus 200 μm.

The width of each branch of the plurality of branches of the first electrode 101 created is less than 10 μm, and preferably less than or equal to 5 μm.

The first electrode 101 created comprises two additional sections 109a, 109b linking all the longitudinal ends of the branches of the plurality of branches and forming, with two distal branches of the plurality of branches, a closed track surrounding all the other branches of the plurality of branches.

The emissive face of the stack comprising a peripheral edge 110, said first electrode 101 created adopts a form such that any point of said first electrode is situated at a minimum distance from said peripheral edge of between ¼ and ½ of the determined spreading length.

In a manner applicable to everything that has been stated previously, the peripheral edge of the emissive face of the stack adopts the form of a closed loop, notably of substantially rectangular or square form, and is distant from the first electrode by the specified distance at any point.

Obviously, the invention also relates to a method for fabricating a light-emitting diode as described, such a fabrication method comprises a step of implementing the method for creating the first electrode described above, and a step of forming the first electrode 101 on the emissive face 105 of the stack 103 of the light-emitting diode. The fabrication method can also comprise all the technological steps to form the different parts of the light-emitting diode as described previously.

Figure 7:
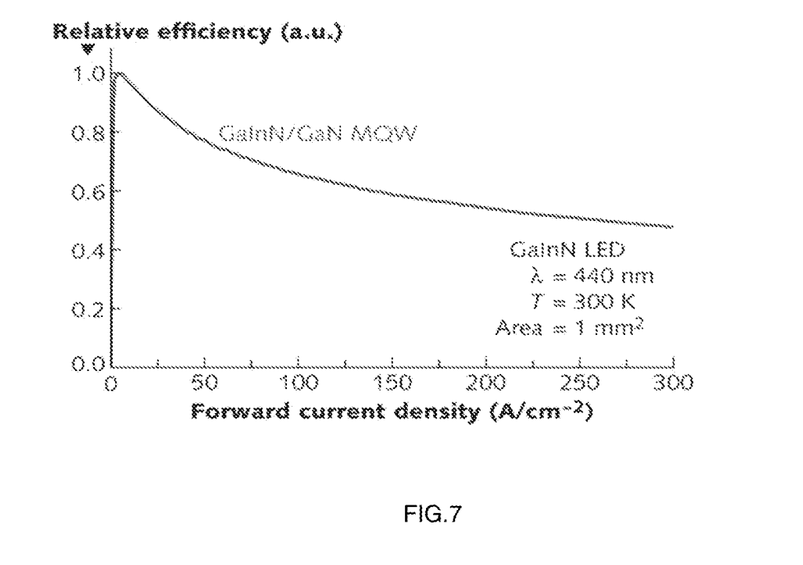
FIG. 7 illustrates the relative effectiveness as a function of the returned current density for a diode of GaInN with a wavelength of 440 nm over an area of 1 mm$^2$ at a temperature of 300 K.

Preferably, obtaining a current density that is as uniform as possible in a light-emitting diode does not mean that the diode is more effective (FIG. 7). This is notably due to the "droop" effect. The "droop" effect is linked to the fact that the light efficiency of a diode reaches a peak at low current densities before decreasing while the current density increases. The "droop" effect typically occurs at the moment when the current density reaches a few tens of amperes per square centimeter. In the context of the present invention, efforts are made notably to maximise the efficiency of the diode when Ls is low. The particular arrangement of the first electrode of the diode as defined above makes it possible to counter this "droop" effect; a better diode efficiency is therefore obtained.

The invention claimed is:

1. A method for creating a first carrier injection electrode for a light-emitting diode, the method comprising:
   determining a current spreading length of a stack of the light-emitting diode intended to be equipped with a first electrode, and
   determining from the determined current spreading length at least one characteristic of the first electrode to be arranged on an emissive face of the stack of the light-emitting diode,
   so that the first electrode is configured in such a way that any point of an emissive surface is situated at no more than a predetermined maximum distance from the first electrode dependent on the current spreading length of the light-emitting diode, and the first electrode comprising a plurality of branches substantially parallel to one another, the distance separating two adjacent branches being between ⅔ of the current spreading length and 1 times the current spreading length plus 200 μm,
   wherein the emissive face is defined by a face on the light-emitting diode through which a majority of light is emitted, and
   wherein the emissive surface is delimited by areas of the emissive face of the light-emitting diode not covered by the first electrode,
   wherein the current spreading length corresponds to a distance for which the current density has dropped by a ratio 1/e between (i) a first point contained in a plane of an active layer of the stack and peripheral to a volume shadowed by the first electrode and (ii) a second point contained in the same plane, wherein e is Euler's number.

2. The method according to claim 1, wherein the current spreading length is calculated from characteristics of the stack and of a second electrode to be arranged on the stack of the light-emitting diode.

3. The method according to claim 1, wherein, the current spreading length being less than or equal to 60 μm, the distance separating two adjacent branches of the first electrode is between 2 times the current spreading length and 2.5 times the current spreading length plus 50 μm.

4. The method according to claim 1, wherein, the current spreading length being greater than or equal to 30 μm, the distance separating two adjacent branches of the first electrode is between ⅔ times the current spreading length plus 50 μm and ⅔ times the current spreading length plus 200 μm.

5. The method according to claim 1, wherein a width of each branch of the plurality of branches of the first electrode is less than 10 μm.

6. The method according to claim 5, wherein the width of each branch of the plurality of branches of the first electrode is less than or equal to 5 μm.

7. The method according to claim 1, wherein each branch has a longitudinal end and the first electrode comprises two additional sections linking all the longitudinal ends of the branches of the plurality of branches and forming, with two distal branches of the plurality of branches, a closed track surrounding all the other branches of the plurality of branches.

8. The method according to claim 1, wherein a distance between a peripheral edge of the emissive face of the stack and the first electrode is between ¼ and ½ of the current spreading length.

9. A method for fabricating a light-emitting diode, comprising:
   implementing the method for creating the first electrode according to claim 1, and
   forming the first electrode on the emissive face of the stack of the light-emitting diode.

10. The method according to claim 1, wherein the at least one characteristic includes a form of the first electrode.

11. The method according to claim 1, wherein the at least one characteristic includes a number of branches of the first electrode.

12. The method according to claim 1, wherein a distance between any point of the emissive surface and the first electrode is between ⅓ of the current spreading length and ½ of the current spreading length plus 100 μm.

13. The method according to claim 1, wherein the current spreading length Ls is determined based on a formula:

$$Ls = \sqrt{(\Sigma\rho_c + \Sigma\rho_\perp \cdot d_\perp) \cdot \left|\frac{\rho_n}{d_n} - \frac{\rho_e}{d_e}\right|^{-1}}$$

wherein $\Sigma\rho_c$ is a sum of contact resistance between an n-doped semiconductor element, a second electrode, and a p-doped semiconductor element in the stack of the light-emitting diode, wherein $\Sigma\rho_\perp.d_\perp$ is a sum of products of a resistivity and a thickness of each of the n-doped semiconductor element, the second electrode, and the p-doped semiconductor element, the thickness being measured in a direction normal to the emissive surface of the stack of the light-emitting diode wherein $\rho_n$ is the resistivity of the n-doped semiconductor element, wherein $d_n$ is the thickness of the n-doped semiconductor element, wherein $\rho_e$ is the resistivity of the second electrode, and wherein $d_e$ is the thickness of the second electrode.

14. The method according to claim 13, wherein $\Sigma\rho_c$ is estimated to be zero.

15. Method for fabricating a light emitting diode, comprising:
  implementing the method for creating a first electrode according to claim 13, and
  forming the first electrode on an emissive face of a stack of the light-emitting diode.

16. The method according to claim 1, wherein the emissive face is an end face on the light-emitting diode.

17. The method according to claim 1, wherein the at least one characteristic includes a dimension of a one-dimensional mesh to be formed by the branches of the first electrode.

18. A method for creating a first carrier injection electrode for a light-emitting diode, the method comprising:
  determining a current spreading length of a stack of the light-emitting diode intended to be equipped with a first electrode, and
  determining from the determined current spreading length at least one characteristic of the first electrode to be arranged on an emissive face of the stack of the light-emitting diode,
  so that an area between a peripheral edge of the emissive face of the stack and the first electrode defines a portion of an emissive surface,
  wherein the emissive face is defined by a face on the light-emitting diode through which a majority of light is emitted, and
  wherein the emissive surface is delimited by areas of the emissive face of the light-emitting diode not covered by the first electrode,
  wherein the current spreading length corresponds to a distance for which the current density has dropped by a ratio 1/e between (i) a first point contained in a plane of an active layer of the stack and peripheral to a volume shadowed by the first electrode and (ii) a second point contained in the same plane, wherein e is Euler's number.

19. The method according to claim 18, wherein a distance between the peripheral edge of the emissive face of the stack and the first electrode is between ¼ and ½ of the current spreading length.

20. The method according to claim 18, wherein the first electrode comprises a plurality of branches substantially parallel to one another, the distance separating two adjacent branches being between ⅔ of the current spreading length and 1 times the current spreading length plus 200 μm.

21. The method according to claim 20, wherein a distance between any point of the emissive surface and the first electrode is between ⅓ of the current spreading length and ½ of the current spreading length plus 100 μm.

22. The method according to claim 18, wherein the emissive face is an end face on the light-emitting diode.

23. The method according to claim 18, wherein the current spreading length Ls is determined based on a formula:

$$Ls = \sqrt{(\Sigma\rho_c + \Sigma\rho_\perp \cdot d_\perp) \cdot \left|\frac{\rho_n}{d_n} - \frac{\rho_e}{d_e}\right|^{-1}}$$

wherein $\Sigma\rho_c$ is a sum of contact resistance between an n-doped semiconductor element, a second electrode, and a p-doped semiconductor element in the stack of the light-emitting diode, wherein $\Sigma\rho_\perp.d_\perp$ is a sum of products of a resistivity and a thickness of each of the n-doped semiconductor element, the second electrode, and the p-doped semiconductor element, the thickness being measured in a direction normal to the emissive surface of the stack of the light-emitting diode wherein $\rho_n$ is the resistivity of the n-doped semiconductor element, wherein $d_n$ is the thickness of the n-doped semiconductor element, wherein $\rho_e$ is the resistivity of the second electrode, and wherein $d_e$ is the thickness of the second electrode.

24. The method according to claim 23, wherein $\Sigma\rho_c$ is estimated to be zero.

25. The method according to claim 18, wherein the at least one characteristic includes a dimension of a one-dimensional mesh to be formed by the branches of the first electrode.

26. Method for fabricating a light emitting diode, comprising:
  implementing the method for creating a first electrode according to claim 18, and
  forming the first electrode on an emissive face of a stack of the light-emitting diode.

* * * * *